US00RE49602E

(19) United States
(12) Reissued Patent
Kruit et al.

(10) Patent Number: US RE49,602 E
(45) Date of Reissued Patent: *Aug. 8, 2023

(54) LITHOGRAPHY SYSTEM, SENSOR AND MEASURING METHOD

(71) Applicant: ASML NETHERLANDS B.V., Veldhoven (NL)

(72) Inventors: Pieter Kruit, Delft (NL); Erwin Slot, Zoetermeer (NL); Tijs Frans Teepen, Tilburg (NL); Marco Jan-Jaco Wieland, Delft (NL); Stijn Willem Herman Karel Steenbrink, Den Hague (NL)

(73) Assignee: ASML Netherlands B.V., Veldhoven (NL)

( * ) Notice: This patent is subject to a terminal disclaimer.

(21) Appl. No.: 16/896,953

(22) Filed: Sep. 2, 2020

Related U.S. Patent Documents

Reissue of:
(64) Patent No.: 7,868,300
Issued: Jan. 11, 2011
Appl. No.: 11/521,705
Filed: Sep. 14, 2006

U.S. Applications:
(60) Continuation of application No. 14/469,544, filed on Aug. 26, 2014, now Pat. No. Re. 48,046, which is a
(Continued)

(51) Int. Cl.
*H01J 3/00* (2006.01)
*H01J 37/317* (2006.01)
(Continued)

(52) U.S. Cl.
CPC ..... *H01J 37/3177* (2013.01); *B82Y 10/00* (2013.01); *B82Y 40/00* (2013.01); *H01J 37/3045* (2013.01);
(Continued)

(58) Field of Classification Search
CPC .. H01J 37/304; H01J 37/3045; H01J 37/3177; H01J 2237/2443;
(Continued)

(56) References Cited

U.S. PATENT DOCUMENTS 5,892,230 A 4/1999 Goodberlet et al.
6,509,127 B1 1/2003 Yamashita
(Continued)

FOREIGN PATENT DOCUMENTS

CN 1293450 A 5/2001
CN 1300097 A 6/2001
(Continued)

*Primary Examiner* — James A Menefee
(74) *Attorney, Agent, or Firm* — Finnegan, Henderson, Farabow, Garrett & Dunner, LLP

(57) ABSTRACT

Lithography system, sensor and method for measuring properties of a massive amount of charged particle beams of a charged particle beam system, in particular a direct write lithography system, in which the charged particle beams are converted into light beams by using a converter element, using an array of light sensitive detectors such as diodes, CCD or CMOS devices, located in line with said converter element, for detecting said light beams, electronically reading out resulting signals from said detectors after exposure thereof by said light beams, utilizing said signals for determining values for one or more beam properties, thereby using an automated electronic calculator, and electronically adapting the charged particle system so as to correct for out of specification range values for all or a number of said charged particle beams, each for one or more properties, based on said calculated property values.

20 Claims, 5 Drawing Sheets

Related U.S. Application Data division of application No. 13/738,947, filed on Jan. 10, 2013, now Pat. No. Re. 45,206, which is an application for the reissue of Pat. No. 7,868,300.

(60) Provisional application No. 60/718,143, filed on Sep. 15, 2005.

(51) Int. Cl.
*B82Y 10/00* (2011.01)
*B82Y 40/00* (2011.01)
*H01J 37/304* (2006.01)

(52) U.S. Cl.
CPC ..... *H01J 2237/2443* (2013.01); *H01J 2237/2446* (2013.01); *H01J 2237/30433* (2013.01); *H01J 2237/31757* (2013.01)

(58) Field of Classification Search
CPC ..... H01J 2237/2446; H01J 2237/30433; H01J 2237/31757
See application file for complete search history.

(56) References Cited

U.S. PATENT DOCUMENTS

| | | | | |
|---|---|---|---|---|
| 6,791,094 | B1 * | 9/2004 | Olson et al. | 250/397 |
| 6,831,282 | B2 | 12/2004 | Yahiro | |
| RE45,206 | E * | 10/2014 | Kruit | H01J 37/3177 250/397 |
| RE48,046 | E * | 6/2020 | Kruit | H01J 37/3045 |
| 2001/0003655 | A1 | 6/2001 | Tokunaga | |
| 2005/0029473 | A1 | 2/2005 | Muraki et al. | |

FOREIGN PATENT DOCUMENTS

| | | |
|---|---|---|
| CN | 1580955 A | 2/2005 |
| EP | 1 505 630 | 2/2005 |
| EP | 1505630 A | 2/2005 |
| JP | 2002-170767 | 6/2002 |
| JP | 2005-347054 | 12/2005 |
| WO | WO 98/54746 | 12/1998 |
| WO | WO 9854746 A1 | 12/1998 |

* cited by examiner

LITHOGRAPHY SYSTEM, SENSOR AND MEASURING METHOD

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

The present patent application *is a continuation reissue of application Ser. No. 14/469,544, filed Aug. 26, 2014, which is a divisional reissue of application Ser. No. 13/738,947 filed Jan. 10, 2013, and issued as U.S. Pat. No. RE45,206, on Oct. 28, 2014. Application Ser. No. 13/738,947 is also a reissue application for U.S. Pat. No. 7,868,300 B2, issued on Jan. 11, 2011, from application Ser. No. 11/521,705, filed Sep. 14, 2006, which* is a non-provisional application claiming the priority of a provisional application of Application No. 60/718,143, filed Sep. 15, 2005. *The contents of the above-identified applications are incorporated herein by reference in its entirety.*

*Notice: More than one reissue application has been filed for U.S. Pat. No. 7,868,300. The reissue application numbers are Ser. Nos. 13/738,947, 14/469,544, and the present application.*

BACKGROUND OF THE INVENTION

The present invention relates to a multi particle beam lithography system, a sensor therefore and a method. Such lithography systems, alternatively denoted litho system, generally operate according to a method for transferring a pattern onto the surface of a target, thereby normally using a so called particle beam tool for generating said multitude of charged particle beamlets, which beams may be scanned in one or more directions by means of electronic controls. The multitude of beamlets, also denoted writing beams in the following is to be calibrated by means of a sensor. A method upon which such litho system is commonly based comprises the steps of generating a plurality of writing beams for writing said pattern on said target surface, usually a wafer or a mask. Preferably a writing beam is constituted by an electron beam, emitted by a writing beam source, which may e.g. comprise a cathode, and which may be supplemented with writing beam shaping means such as an array of apertures for converting a beam emitted by said source into a massive plurality of significantly smaller diameter. Also, such known litho system may be provided with collimating means for directing a source beam or a set of generated writing beams into parallel.

In such known method each writing beam is deflected separately at writing said pattern on to said target surface, for interrupting said writing process. This is performed by means of e.g. an array of electrostatic deflectors and beamlet blankers through which the writing beams are passed within the system. Especially in case of a massively multi writing beam system as according to the present invention, such deflectors are provided with so called modulation information by a signalling means. Such part of a lithography system for writing patterns onto wafers or masks, is in the following denoted a beam tool. Such beam tool and such lithography system can in more detail be known from e.g. patent publication WO2004038509 in the name of Applicant.

Further typifying the electron beam lithography under consideration, application thereof is directed to high-resolution purposes. Nowadays applications are capable of imaging patterns with a critical dimension of well below 100 nm feature sizes. Multi beam in this respect in particular relates to so-called massive multi beam system comprising e.g. a number of writing beams in the order of 10000 and higher. In this respect a typical application as currently offered by Applicant comprises 13.000 writing beams. Future developments however are focussed to litho tools comprising a number of beams in the order of 1 million, which systems are intended to utilise a principally same kind of sensor.

Such exposure lithography systems only become commercially viable when at least the position of all of the electron beams is precisely controlled. Due to various circumstances such as manufacturing tolerances and thermal drift, a beam generated in the writing beam tool of a lithography system is however likely to have one or more errors which render it invalid for writing. Such error may be a positioning error, with respect to a designed grid. Such erroneous feature of a beam tool, and therewith of the lithography system, severely affects the quality of the pattern to be written. Yet, the position of an e-beam near the surface to be exposed is required to be known within a distance of a few nanometers and should be able to be calibrated. In known litho systems this knowledge is established by frequent calibration of the beam position.

Apart from above mentioned specific feature, also other features of writing beam are desired to be known accurately and preferably at multiple instances, and therefore swiftly, during operation of the beam tool, in particular during writing of a wafer, so as to allow an early adaptation of the writing process of a wafer, and to thereby increase the number and chance of correctly written waters or fields thereof.

Known calibration methods commonly comprise at least three steps: a measuring step wherein the position of the electron beam is measured, a calculating step wherein the measured position of the electron beam is compared to the desired position of that beam, and a compensation step wherein the difference between the measured position and the desired position is compensated for, either in the software or in the hardware of the lithography system or said electron beam tool thereof.

Such known measuring or calibration systems hardly pose any inhibit to electron beam lithography tools which are characterised by a relatively low throughput, e.g. only part of a wafer is patterned within one hour, or by a relatively limited number of writing beams as compared to a massively multi beam system, For maskless systems directed at high throughput or with a massively multi beam system as is focused on by the present invention, the known calibration systems form a limiting factor to the desired high capacity and high throughput, maskless lithography system.

With the known methods, a charged particle beam system, e.g. an electron beam based system, needs to be calibrated a large number of times. Where this may be acceptable for a single beam litho system or with a number of beams, this circumstance becomes a problem if 13000 or more beams are to be calibrated in series. In such case the time needed for calibration would far outweigh the time needed for actually treating a field on a wafer. Therefore, so as to increase the throughput of the known litho system, and in accordance with an idea underlying the present invention, the calibration procedure should be speeded up significantly.

In the art, several calibration methods for electron beam lithography systems are known. Most use marks residing in either the wafer stage or the wafer or in both. A sensor then performs e.g. the detection or the position of a beam. The sensor being a charged particle sensor, measures the amount of secondary or reflected electrons created by the marker.

One example of a method using charged particle sensors in combination with a plurality of charged particle beams is provided by the U.S. Pat. No. 5,929,454. It discloses a method to detect the position of a plurality of electron beams by using marks positioned on the wafer or stage. The mark is a parallel line pattern and used for several measurements. All measurements are performed by detection of either secondary or reflected electrons from said alignment mark upon scanning. The position of the alignment mark is determined on the basis of the displacement amount of the electron beams and the detection result. Such an electron detector has the advantage of rapidly determining any primary or secondary electrons, however is relatively bulky, i.e. measures within a range of mm, and thereby not suited for litho systems utilising a massive multiplicity of charged particle beams, e.g. 13000 beams or more. In such latter kind of litho systems a typical pitch between beams is in the order of tenths of mm, e.g. typically 150 μm in a present day 13.000 beam system. Apart from the above volume feature of the known sensor and calibrating system, the known system is also relatively expensive, and moreover not capable of calibrating a massive amount of charged particle beams in qualitative and sufficiently swift manner.

In a massively multi-electron-beam lithography system also other problems arise, in that e.g. adjacent beams should not influence the accuracy of the position detection. Also, it is not clear with the known method and system how to perform both data acquisition and data processing within a reasonable limit of time for all of the massive amount of writing beams, i.e. within a period of time which is much less than the period required for writing a wafer. The latter problem is especially significant because of an additional requirement, at least strongly desired feature common in the art, of frequent calibration of the entire beam tool during the process of writing a wafer, so as to monitor and timely compensate for e.g. said earlier indicated dynamic drift of writing beams. Such manner of proceed prevents undue loss of treated wafers, i.e. of performed work by an expensive machine.

SUMMARY OF THE INVENTION

The present invention solves the problem posed, of swiftly detecting charged particle beam features of a massive multiplicity of beams by converting the charged particle beams into light beams, thereby using a converter element such as a fluorescent screen or a doped YAG (yttrium aluminum garnet) material, subsequently detecting the light beams by means of an array of light sensitive detectors such as diodes, CCD or CMOS devices, alternatively denoted by using a camera, and subsequently electronically reading out the signals of said camera, i.e. of the cells or detectors thereof. In an embodiment the signals of said camera, i.e. of the cells or detectors thereof are read out in a single operation, either successively, preferably at a high clock rate. or in parallel, i.e. simultaneously. The signals are read out after a predetermined period of time of exposure and are used for determining values for one or more beam properties by means of an automated electronic calculator. The calculated property values are used for calibrating all or a number of said writing beams. Such modification may either be performed by electronically modifying pattern data, thereby allowing for the actual beam properties, and/or by influencing the beams themselves. According to preferred embodiment, calibration is solely performed in software by modifying said pattern data.

Such light sensitive detectors generally have a rather poor performance in that the response of light sensitive sensors such as a CCD (charge coupled device) is slow. It is the merit of the present invention however to have conceived that despite such slow response, the surprising composition of the sensor according to the invention, achieves a relatively very fast sensor as compared to utilising one or a number of known electron beam detectors. In this respect advantageous use is made from the capability of reading out a large number of light sensitive detectors, alternatively denoted cells, in a single operation, either successively, preferably at a high clock rate, or simultaneously. In the sensor according to the invention all of the light sensitive detectors are preferably read out simultaneously. Moreover, the present sensor structure, in particular by the array of light detectors, enables a very small pitch of a multiplicity of beams to be measured without the necessity of unduly large structural measures in the region of the stage part of a litho system.

The latter feature of measuring light signals, i.e. photons is known per se from the field of digital cameras, where also a multiplicity of light detectors is electronically read out at least virtually simultaneously. By utilising such a kind of array of detectors, the beam sensor according to the invention may as a further advantage thereat, be realised in a very cost-effective manner. The purpose of measurements according to the present invention is to determine the positioning of writing beams and to determine if they are within specification. Measuring is performed under either one condition where a writing beam is continuous on, or where such beam is set on, on a timed basis. Both types of measuring may be performed in combination for determining a value for different beam properties as will be set out in the following. At measuring according to the invention, so-called point spread functions are determined for each respective writing beam. Rise and fall times of a beam are not measured directly, however are derived from such function.

It is remarked that also the idea of converting charged particle beams into light beams is known per se, in this case however, from yet another technological field, namely from the field of electron microscopes. In this field of technology, directed to accuracy rather than to speediness, it is known per se to convert an electron beam into light using a converter element. Often such converter element is embodied by a so-called YAG (yttrium aluminum garnet) screen, however could e.g. also be a fluorescent screen. The photons subsequently realised by such conversion are received by a so-called photomultiplier for an amplified electric signal that is subsequently to be attained. Such photon-electric conversion is performed by a single converter cell.

In the latter respect, the present invention might also be characterised as having solved the problem posed by the fact that a writing beam size is notionally smaller than the resolution of known sensors. Also at scanning over a mark the known detector is considerably larger than the pitch between two beams of the litho system currently improved: with the known detector the signals of a plurality of writing beams would overlap. As to the further problem and current solution with respect to size of the known detector, it is to be noticed that the scanning detector system according to the invention may, for the said massive multiplicity of beams, typically be applied within a pitch of 150 μm (micrometer).

In this respect, the diameter of a writing beam typically is smaller than 45 nm (nanometer). In contrast, the present invention enables and is directed to a method, system and sensor, wherein the spot size of a charged particle beam is smaller than the resolution of the converter element. This is realised by utilising measured intensity values of a light beam for determining beam properties, in particular in combination with a knife edge, as will be exemplified in the description of the figures. Such determination is performed on the basis of a plurality of signals resulting from a stepping proceed of a charged particle beam which is scanned in one direction at a time over a mark or blocking element.

Furthermore, the light conversion in the manner according to the invention allows the use of relatively cheap light sensitive detectors, i.e. arrays thereof, such as CCD (charged coupled devices) and CMOS (complimentary metal-oxide semiconductors) devices. Such light detectors convert light into intensity counts, often electron based, and have the advantage that they are widely available, technically well known and cost effective. They come in rather compact form, meaning that a very high pixel resolution can be obtained. In other words, a massive amount of charged particle beams, after conversion into light beams, can be sensed at the same time. In line with this advantage, such individual light or pixel sensors can be read out at least virtually simultaneously, that is in a single operation, either successively, preferably at a high clock rate, or simultaneously. An example of this feature is set by reference to the application of such sensors in digital cameras.

By virtue of these above said features of at least virtually simultaneously reading out and conversion a charged particles into light, a relatively slow light sensor as compared to above mentioned known charged particle sensor, can be used to still make the calibration of a massively multi charged particle beam tool both significantly faster and cheaper than at use of charged particle sensors, all without undue requirement of space, and all enabling a for massive multi-beam systems required resolution. The new sensor, calibration method and lithography system enables the calibration of a massive multi charged particle beam tool in a highly economic manner, despite a seemingly complexity due to the number of structuring elements of the new sensor and due to the physical conversion method applied therein.

In a sensor according to the invention an accumulated charge or intensity at each cell is at a predetermined time read out individually. In a CCD device, a charge of a light sensitive element thereof induced by the impingement of light thereon, is normally transported across the chip and read at one corner of an array. An analog-to-digital converter turns each pixel's value into a digital value. In CMOS devices, commonly there are several transistors at each pixel that amplify and move such charge, using wiring for transporting the charge to a read out part of the device.

A rather favourable feature of the present invention over the known sensors for charged particle beams tools is that rather than using scattered or secondary electrons, the new sensor can directly measure one or more writing beams, i.e. in the sense that the sensor can directly be located in the projection of a writing beam, i.e. in the surface area of a wafer, which brings about significant spatial advantages in the design of the beam tool.

A further advantage of the system according to the invention is that despite of the economic nature of it, rather than position only, a multiplicity of features of the beam tool is determined during a single measurement thereof, thus adding up to the efficiency of both the new sensor, and the beam tool to be calibrated. Such features include beam position, beam spot size and beam current, as well as functioning a blanking element common to such beam tools, and timing delay thereof at functioning.

The invention further relates to partly blocking a beam directed to the sensor by means of a blocking element provided with a knife edge, thereby enabling measurement of a maximum dimension of a spot created by said beam on the sensor in a favourable and effective manner. The beam is scanned, in fact stepped relative to the sensor and thereby relative to said knife edge while optionally being switched on and off at predetermined intervals of time, thereby creating a limited amount of data that can favourably be used for deducting beam properties by using line fitting software. Such stepping can according to the invention be repeated for one or more times, preferably each time at increased intervals of time. The beam properties are determined on the basis of a set of signals obtained while mutually shifting the beam blocking element, i.e. mark and the charged particle beam, thereby using a blocking element included at a known position relative to the converter in said sensor.

A beam is preferably stepped over such above mentioned knife edged blocker or mark in at least three directions, thereby enabling ellipse fitting. A mark is thereto preferably embodied hexagonal, thereby favourably optimising sensor time by enabling stepped scanning and detection both in back and forth direction of a beam sweep in one direction. Such mark is according to the invention technically and economically favourably included at a known position relative to the sensor, in particular by structurally integrating it therewith, i.e. mounting it on top, i.e. to the surface of the sensor.

For some measurements, i.e. at least for measuring writing beam current however, a beam is directed at a location on said sensor surface where it is not intercepted by the said beam blocking mark.

Adaptation of the system on the bases of such automatically deducted beam property values is performed by at least one of electronically modifying electronic data, in particular control data, for a pattern to be imaged by said charged particle beam system, modifying line width, and electronically influencing a position modifying means of said beam system, for modifying the position of one or more charged particle beams, in particular by introducing a time delay.

Especially, however not exclusively in the case of Application of a CMOS device, in the sensor according to the invention, a light beam modificator such as a fiber array or a lens system may be integrated between the converter and the receptor for optically modifying, i.e. increasing or decreasing the image of an emitted light beam, thereby optimising the internally generated light beam for the light sensitive receptor.

In a calibrating system according to the invention, values for the above features are derived from a multiple beam sensor by a calculating unit. Correction signals generated by this unit are according to the invention either used for influencing the beam tool, or for influencing an image pattern stored in a computer means, which pattern in fact forms an instruction basis for the beam tool.

Due to the size of the new sensor, it can be and is according to the invention placed at multiple positions in a beam tool. In this manner calibration frequency is increased without wasting valuable operating time by significant movement of the target, i.e. wafer, in particular a sensor associated therewith, for correct positioning thereof relative to the beam tool in use.

In a further elaboration of the method and lithography system according to the invention, the charged particle beam system, at least the beam generating part thereof is provided with an optical sensor. The detector for detecting beam properties, in particular the pattern of blocking elements thereon is utilised for optically detecting the position of said system relative to an independently moveable stage for holding a target surface and comprising said detector.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment of a maskless lithography system according to the current invention shown in the attached drawings, in which.

DETAILED DESCRIPTION OF THE DRAWINGS

Figure 1:
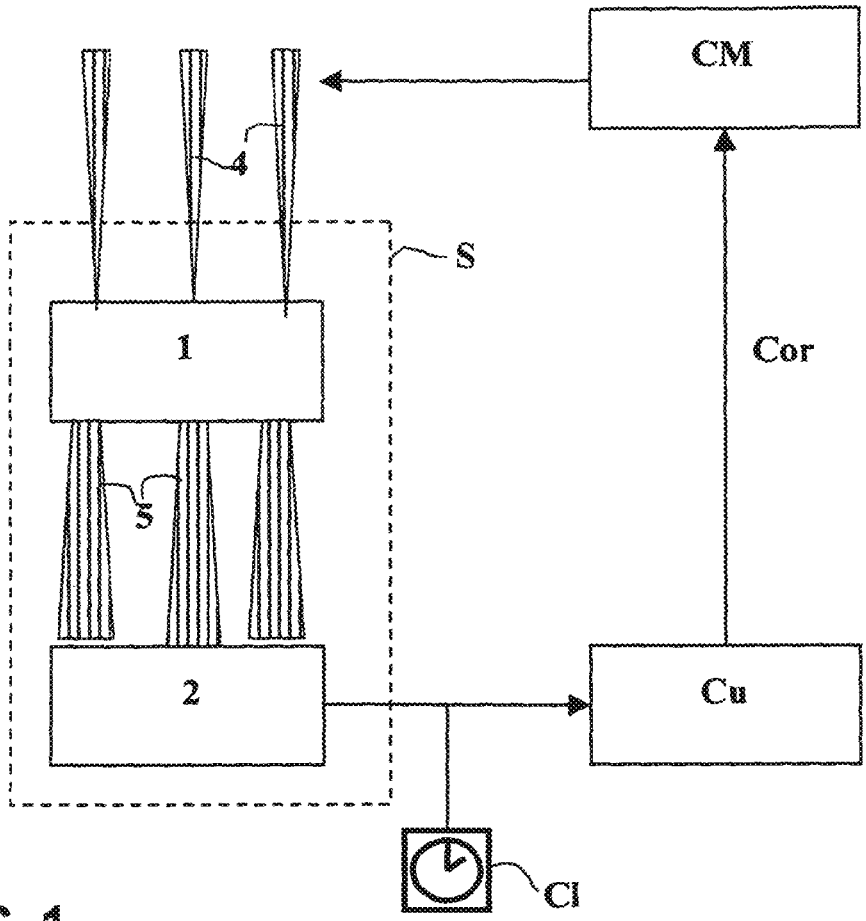
FIG. 1 is a schematic representation of a calibration part of a lithography system comprising a sensor according to the invention.

The present invention provides a design for a lithography system fitted with an electron beam alignment sensor suitable for transferring patterns at contemporary requirements, e.g. of 45 nm and smaller at a speed of 10 wafers or more per hour. The invention includes a new sensor for detecting characteristics of projected charged particle beams such as electron beams within a litho system known per se, e.g. from WO04/038509 in the name of Applicant or within a multi beam inspection tool. The new sensor comprises a scintillator, here in the form of a so-called YAG (yttrium aluminum garnet) material, combined with a CCD (charge coupled device), alternatively denoted camera. The YAG screen applied here is a Ce (Cerium) doped garnet. Features of a charged particle beam are derived by automated, electronic measuring and calculating parts on the basis of a measurement of a signal generated in such a sensor at moving a charged particle beam relative to it. In the present system, normally a writing beam will be moved relative to the sensor by realising a stepping movement of it within a writing beam tool, typically over a distance around the range from a few hundred nm to 2.5 μm. Stepping is in the beam tool performed by influencing an electric field on two deflectors, or on one deflector and a wafer stage. A beam can herewith be scanned in e.g. three different directions. During such scan, a beam blocking part provided with a so-called knife-edge is maintained at a known position in between the beam-generating tool of the system and the said sensor. In a favourable embodiment of the new sensor, the blocking means is fixed to the surface of the sensor.

The known position of said blocking part is attained by at least one and preferably a combination of all within a set of measures comprising good manufacturing practice for accurate positioning, calibration of the system, i.e. performing measurements within the machine at installing it and preferably at regular intervals that are significantly larger than at measuring during writing operation of a wafer and, thirdly, by optically determining the sensor and wafer position relative to the beam tool. With respect to the latter, a particular shape of the blocking part of the sensor is favourably utilised in the present invention. With a known, in casu optically detectable mark on a wafer, and said marks on the sensor, the position of the wafer with respect to the sensor is known using an optical measuring system known per se. Alter also having determined the position of a number of writing beams with respect to the sensor according to the invention in a manner as will be explained in the following, the position of the writing beams relative to the wafer is known. A further measure for enhancement of accuracy at measuring, includes that said blocking part is made as small as possible and that it is included in the sensor on a layer of low coefficient of thermal expansion such as glass, e.g. "zero dur" glass. With the accuracy attained in accordance with the invention, and with the known position of writing beam relative to the sensor, in a preferred embodiment of the invention each writing beam is positioned over a single, related mark on the sensor.

With the system, sensor and method according to the invention a framework is provided for detecting the functioning of a beam tool blanker feature known per se, any time delay thereof, as well as position, current and spot size of all of the beams produced by said beam tool. These features can now, for all beams of a massively multi-beam tool, be detected, within a relatively short period of time, e.g. within a minute. As will be elucidated in the following, time delay, and positioning error of a writing beam may be measured by different measuring methods, with and without using a knife-edge respectively. Time delay in this respect is the delay between an instant of instruction "on" or "off" to the beam tool and the effect thereof at wafer, in casu sensor level.

FIG. 1 illustrates a system part and method in which a sensor S according to the present invention is embedded. Upon impingement of a charged particle beam 4 on sensor S, in particular on converter element 1 thereof, a light beam 5 is emitted by the converter 1, which is received by a camera 2, i.e. at least by a photon receptor 2. After a predetermined time controlled by an electronic system clock Cl, the photon receptor is, i.e. the individual cells are read out in a conventional manner and data is provided to a calculating unit Cu in the system. The calculating unit determines offset from predetermined values of beam features such as position and magnitude, and provides correction values Cor to a control means CM for controlling the charged particle beam tool to be calibrated. This means that either or both of memory stored data for generating a pattern and the beam tool is automatically adapted by said control means. Thus, for measurement of properties of charged particle beams such as electron beams in a multi-beam charged particle system, in a preferred embodiment, a so-called knife edge scan with writing beam blocking marks 6 covering the converter, in casu YAG screen, is performed, the pattern resulting from such scan is imaged from said YAG screen on a camera, preferably a CCD camera.

Figure 2:
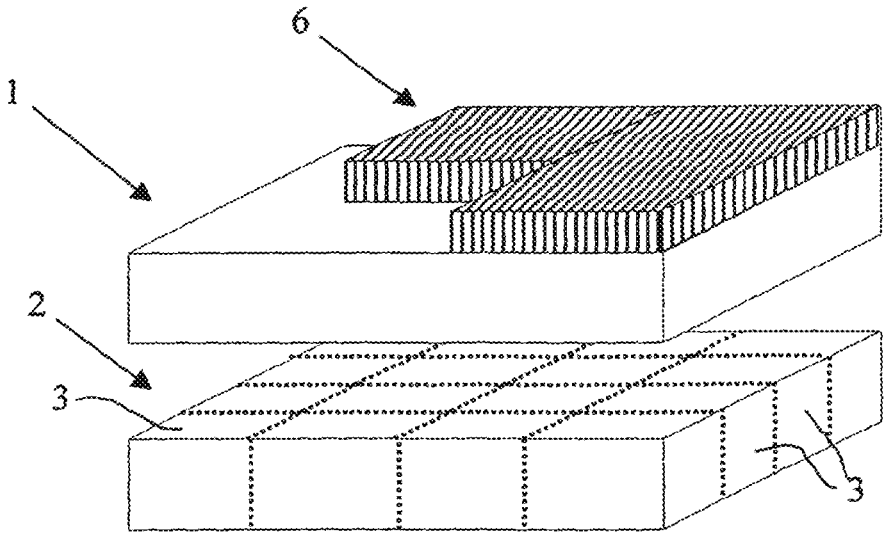
FIG. 2 is a schematic representation of an embodiment of a sensor according to the invention, for determining characteristics of a writing beam for a lithography system.
Figure 3:
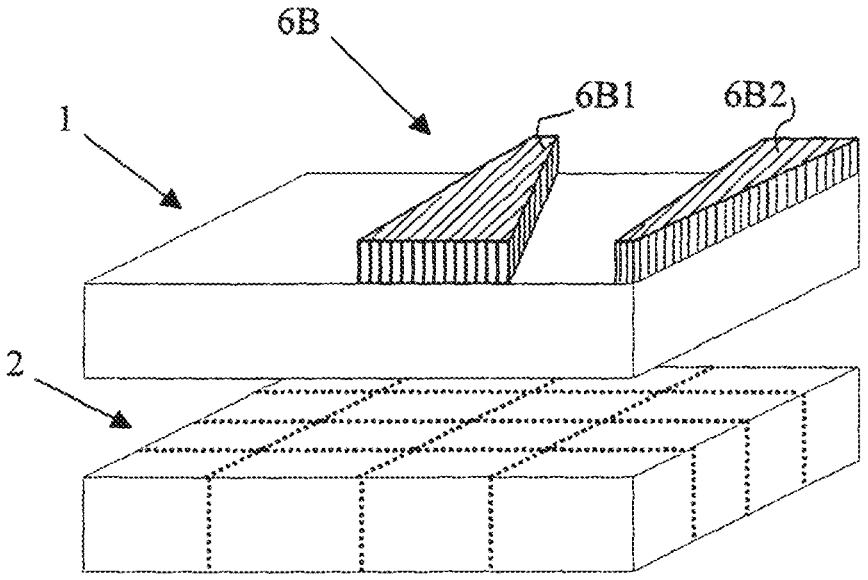
FIG. 3 is a schematic representation of a further embodiment of a sensor for determining characteristics of a writing beam for a lithography system.
Figure 4:
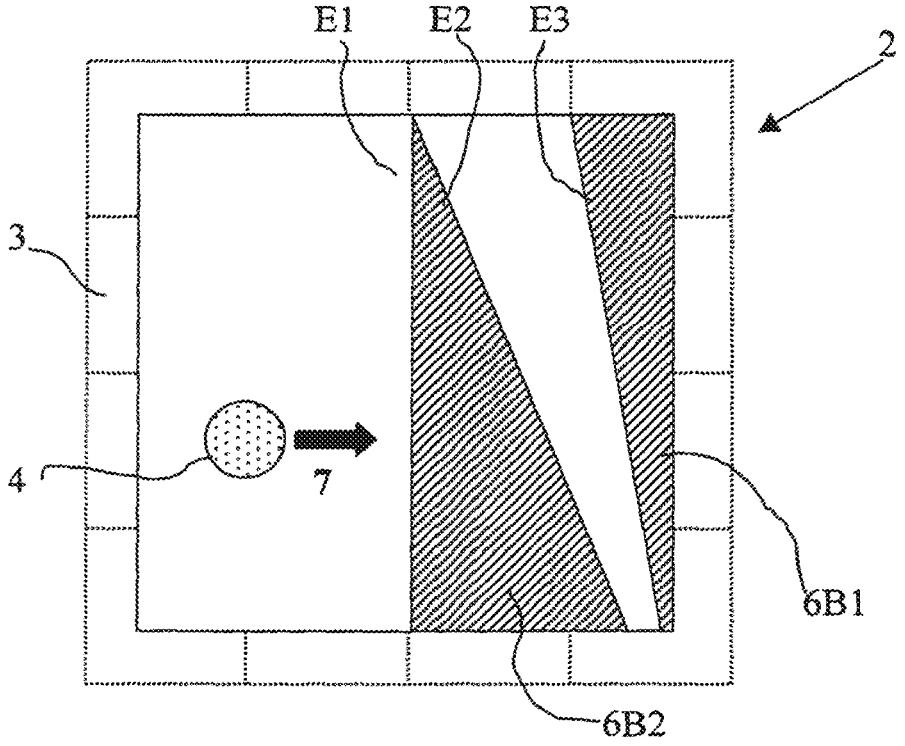
FIG. 4 is a schematic top view of the sensor embodiment according to FIG. 3.

FIGS. 2, 3 and 4 schematically depict embodiments in accordance with the present invention. Besides said beam current, and the X- and Y-position of a beam, a capability of detecting the size of an individual charged particle beam in e.g. x and y-direction is made possible. Converting means 1 are placed on top of photon-receptive means 2. A mark 6 comprising a knife edge, in FIG. 2 referred to as a first exemplary mark 6, is preferably ultimately closely positioned before said converter means 1 in the optical pathway of the charged particle beam 4. The mark 6 can be and is most preferably, as here depicted positioned directly on top of the converting means 1. However said mark 6 may, still in accordance with the invention, alternatively be located at a known location, further away from said converting means 1, for instance on a separate carrier plate transparent for charged particles. In a preferred embodiment, the YAG screen is also included on such carrier when it is incorporated fixed on top of the sensor, thereby allowing a desired ultimate reduction of the thickness of the beam blocking material. The receptive means 2 is in this example composed of a plurality, i.e. a set of grid cells 3 per beam to be calibrated, in casu sixteen cells 3, arranged as a frame of square configuration conforming to preferred embodiment. Yet, in accordance with the basic principle as conceived by the invention, such a frame can also be embodied by a single cell 3.

Though for sake of clarity not depicted in e.g. FIG. 2, in the pathway of an electron beam in the sensor, the latter further comprises a thin layer for blocking background light, e.g. an aluminum layer of a thickness within the range of 30 to 80 nm, included between a mark 6 or charged particle blocking layer of the sensors and the converter. Such background light blocking layer enhances quality of the sensor by preventing background light from interfering with the light generated by the converter, i.e. with a writing beam.

The beam blocking layer or mark 6 should according to the invention be thick enough to sufficiently block an incoming charged particle beam, while on the other hand should be thin enough to minimise defocus and edge roughness effects. Thus a mark 6 is composed of a heavy metal, preferably of a tungsten alike material, in a thickness generally within the range of 50 to 500 nm.

The mark 6 in the embodiment according to FIGS. 3 and 4 is composed of two spatially separated parts 6B1 and 6B2, and shows, in the direction 7 of scanning, a first perpendicularly to said direction 7 oriented knife edge E1, and two subsequent knife edges E2 and E3, each oriented under a different sharp angle with said direction as taken in top view. By the presence of at least one such sharp angle, only one direction 7 of scanning is required for measuring spot position. This measurement is improved without significant increase in required scanning time, by including two sharp edges E2 and E3, each oriented under a different angle. A further sensor embodiment including a mark 6C, and requiring more scanning time, however providing a relatively superior signal quality is disclosed along FIG. 6.

Figure 5:
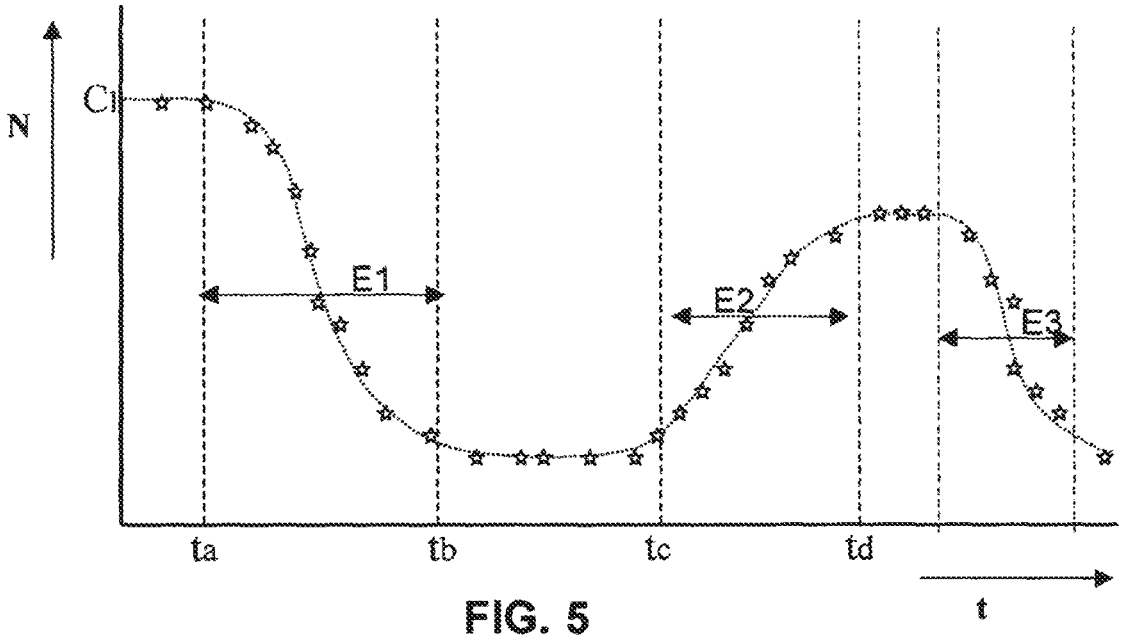
FIG. 5 is an illustration of a signal derived from the sensors according FIGS. 3 and 4.

A potential result of the scan performed in perpendicular direction over an edge of exemplary mark 6B depicted in FIG. 4 is drawn in FIG. 5, which represents a detected number of counts CI after a number of steps t. Before reaching the left edge E1 of said exemplary mark 6, the photon-receptive means 2 counts the number of photons in the entire beam, i.e. a constant number of photons CI, is detected per unit of time. When the right side of the charged particle beam 4 hits the left edge E1 of the mark 6 at step tA while moving towards the right into direction 7, fewer electrons will be converted thus fewer photons will be detected by the photon-receptive means 2. By comparing the expected step of reaching said left edge A, the actual position of the charged particle beam 4 in said first direction is in accordance with the invention determined. While moving said charged particle beam 4 further in said direction 7, fewer and fewer photons are detected. Eventually at step tB, the number of detected photons reaches a minimum value. The charged particle beam 4 is now entirely blocked by the mark 6B. The length of the scan corresponding to the steps between tB and tA is a measure for the size of the beam 4 in said first direction 7. The step where the intensity is at the middle between high and low level at an edge E1-E3 is taken as the beam position. A following edge E2 that the beam will pass while moving in the first direction 7 is not oriented perpendicular to said first direction 7. Due to the orientation of this second edge E2, the writing beam 4 will reach said edge E2 at a different step tC depending on its position in a the direction perpendicular to said first direction in the plane of the sensor, i.e. as taken in top view. Continuing the movement in the first direction 7, more and more photons are detected by the photon-receptive means 2. In the depicted embodiment a position measurement in multiple directions is thus enabled by scanning in a single direction. A possible disadvantage of this detector and method may however be constituted by the amount of data that is required to measure the writing beam properties. This current disadvantage however is anticipated to disappear with the evolution of computing technology.

So as to allow for sufficient scans to average out so-called measuring noise in a method and system according to the invention, a fast camera with binning capabilities is utilised. A predetermined minimum number of scans is performed so as to attain a desired accuracy for determining the beam position within the requirement. With the present type of detector it is not needed that there is no dead area, both a CCD and a CMOS cameras are equally feasible. Actual application of either of the two is based on accuracy of available camera, binning capability and, very important, readout speed and possible frames per second.

Figure 6:
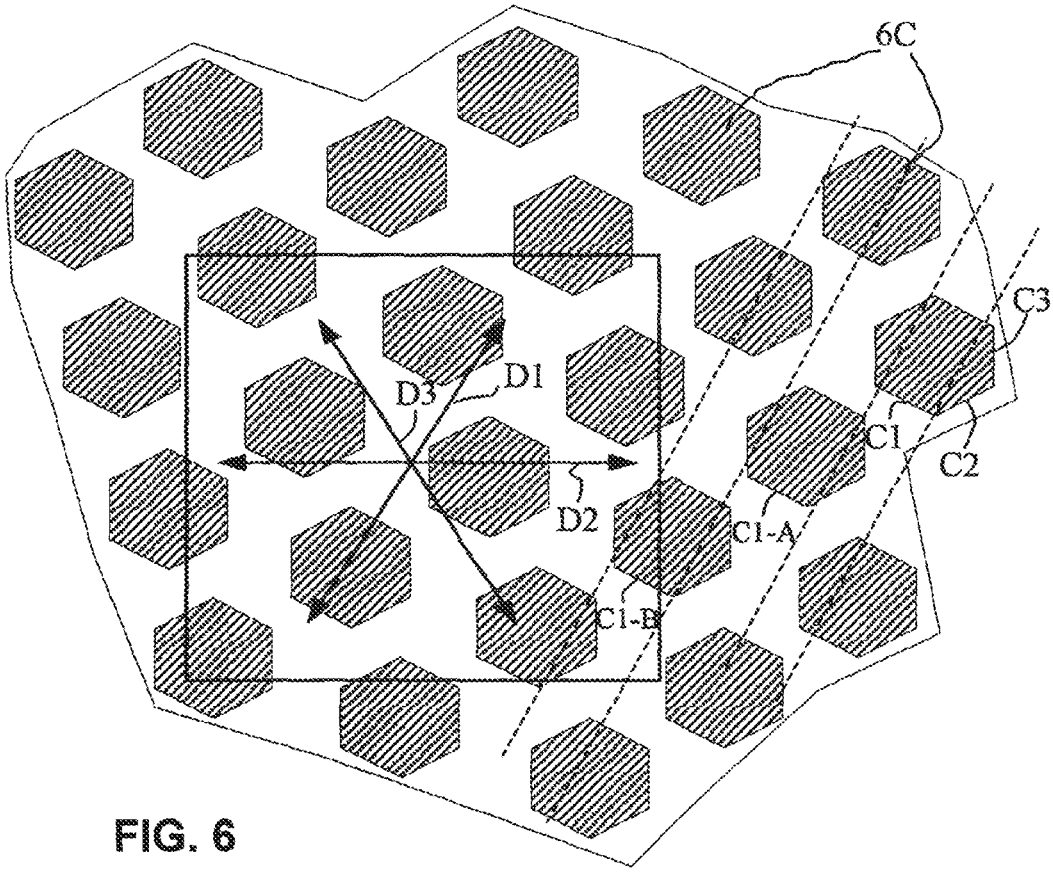
FIG. 6 in a top view represents yet an alternative and currently preferred embodiment of a regularly shaped six-angular mark to be included in a sensor.

At using a knife edge scan and an appropriate mark 6, not only the position and the current of a single writing beam is determined, but also the spot size in two or three directions as in accordance with a preferred embodiment. By scanning over the mark 6B the measurement signal will be as in FIG. 5, or as in FIG. 7 at applying mark 6C of FIG. 6. From the rise and fall of a signal, both the position and the sigma of the Gaussian beam are obtained. The beam current is obtained from the maximum signal. A possible and currently preferred mark 6 is shown in FIG. 6. With the knife-edge scans, all of spot position, spot size, spot current, and timing delay and functioning of blanker are in accordance with the invention may be measured as major properties of individual writing beams.

One property that according to an elaboration of the invention may be measured in an advantageous way is the beam position relative to the blanking information grid. In other words, the real beam position that corresponds to a blanking signal. Detected displacement of the writing beam is according to yet further work out split up in the real physical displacement of the beam and the relative time delay of a blanking signal with respect to the internal clock Cl in a lithography system according to the invention, in which the charged particle beam is turned on and off by a blanker means acting upon an electronic (blanking) signal. At calibrating a single beam, both contributions are corrected for.

The easiest way to calibrate said position and timing error is to measure the total displacement in one time. In accordance with a further aspect of the invention, the total of displacement is measured in a single instant. This is performed by blanking the writing beam. A writing beam 4 is scanned over the sensor S and switched on when it is at a pre-determined lay-out position. The beam 4 is switched on for a pre-defined period of time. The for measurement required number of electrons is obtained by performing multiple scans over the detector 6. Since in this approach of measuring, which advantageously reduces noise, the spot of a writing beam 4 on the sensor S, is obtained by blanking the beam 4 within the beam tool producing the beam 4, both the physical displacement and the time delay is measured. Advantageously in a further kind of measuring, the beam 4 is switched on and off for a multiplicity of times at different positions.

It may be clear that by departing from the preceding, various embodiments within the scope of the current invention may further be developed. One example of such is provided by FIG. 6, which schematically shows the top surface of a sensor in accordance with the invention, showing a multiplicity of equally oriented blocking elements 6, here denoted 6C. The blocking elements include at least three sharp edges C1, C2, C3 mutually oriented under an angle of 120 degrees. In this manner according to the invention, the measured spot properties can be fitted with an ellipse shape. Alternatively angles of 60 degrees could be used, forming a regular triangle. In this way scanning may be performed in at least three directions as is preferred. In a further elaboration of the invention however, such blocking element 6C is provided with angles larger than 90 degrees. With such a measure, in accordance with a concept underlying the invention, the chance of a projected focused beam entirely being intercepted by the mark is optimised. Alternatively posed, the chance of a beam spot being scanned over an edge part of the mark, thereby disrupting the measured signal, is minimised. Secondly, with an angle larger than 90 degrees, knife-edge scans may still be performed in more than two directions, enhancing the capability of determining spot shape and size. The most preferred mark is composed as a regular six angular shape, comprising two sets of such sharp edges C1, C2, C3. In this manner both of the earlier mentioned features are integrated in the mark, while moreover the mark provides the possibility to collect a signal both at moving back and forth.

In a further elaboration of the preferred sensor, a plurality of the preferred hexagon shapes is included on the surface of a sensor for each beam to be calibrated. In this way both a chance of a rightly positioned scan as well as the quality of measurement by having multiple, independent sharp edges within one direction is increased. In a method for utilising such a kind of sensor, scanning is performed preferably back and forth in multiple directions D1 to D3 as indicated in the drawing, each direction D1 to D3 being perpendicular to one of said sharp edges C1 to C3. All of the marks on the surface of the sensor have the same spatial orientation. They are preferably arranged such that at scanning a charged particle beam in one particular direction perpendicular to one of the edges of a mark, the scanned beam will encounter a correspondingly oriented edge irrespective of its position with respect to the sensor. In other words, correspondingly oriented edges of different marks join to each other, while being dislocated. In this manner a scanned beam will in the neighbourhood of the position where it was switched on, always encounter a knife edge oriented in the same direction, i.e. in near vicinity marks, i.e the knife edges thereof adjoin in the in the parallel direction. Such scan D1, D2 or D3 of a beam 4 may take place over a width on said target surface area of e.g. about 2.5 μm. Otherwise posed, the mutual position of sensor, i.e. the marks thereon and beam tool is such that at scanning in one direction the chance of encountering a knife edge is one. Favourably, the knife edges are measured a number of times the largest expected spot width, e.g. are measured by a factor within the range of 1 to 6 times said width or diameter in case of an expected round spot shape. With respect to number of marks per writing beam, a ratio of a plurality of marks per writing beam may be utilised, thus enhancing the chance of swiftly encountering a knife edge within the scanning range at scanning a charged particle beam. However, an even more swift result is according to the invention attained in an embodiment where a ratio of one mark per beam is applied, which ratio is a.o. advantageous in that the absolute position of a beam can easily be determined. A typical width of a knife-edge C1-C3 in the present example with only 13000 writing beamlets, having a typical spot size of 45 nm, would be around 270 nm, in the current example raised to 300 nm.

Figure 7:
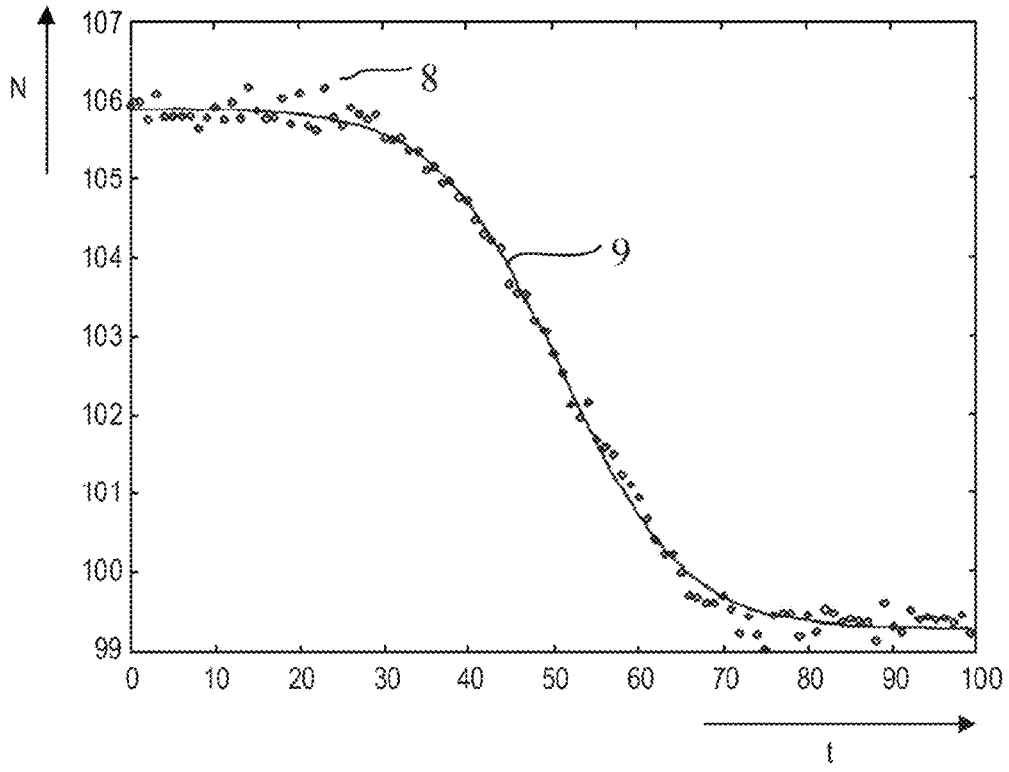
FIG. 7 provides the a signal as derived from a spot crossing a mark, e.g. as in FIG. 6, used for determining spot size and position in the direction of relative mutual movement between beam spot and mark, i.e. sensor.

FIG. 7, in a manner corresponding to that of FIG. 5, by bullets 8 provides an exemplary set of measurement data of at least one scan over a plurality of sharp edges in one direction, e.g. a plurality of edges C1, and a fit trace 9 mathematically deducted from said set of measuring data. Since the present sensor for measuring a massive multiplicity of writing beams is devised rather slow, the measuring frequency is low as compared to utilised at microscopy. Where in the latter case measuring is performed in the order of kHz rather than in the order of Hz as in the present case, alternatively denoted, where a virtually continuous signal is attained, the present measuring system departs from the underlying insight that a limited number of measuring data, e.g. 6 readings per second, may be sufficient if a fit is performed, as well as from the insight that a fit, rather than a virtually actual trace is sufficient for the purpose of deriving the above described beam tool characteristics. In the latter respect, e.g. the slope of fit trace 9 is an indication of the spot size in the scanning direction. With the presently devised sensor, detection of feature values for a massive multiplicity of writing beams to be calibrated will in most cases be significantly faster than at repositioning the known, relatively fast photocell and knife edge sensor, as known from microscopy, from beam to beam as would in the use thereof be required for a multi beam tool. From a signal thus attained, apart from e.g. timing delay information, also rise and fall time is deducted, and the beam current of a writing beam is derived.

It goes without saying that various other shapes than here above mentioned may be devised for realising sharp edge scans in even more than three, i.e. in a multitude of directions. Three directions of scanning is however considered a reasonable amount of scanning direction for economically rather precisely determining e.g. spot size and shape. Thus, in fact measuring is performed by stepping over the sensor, rather than scanning. At stepping, a beam is (switched) on when it is relative to the sensor positioned at its expected location. From the deviation of the derived signal with regard to the expected signal, the spot position error and timing error of the blanker of the beam tool is derived. A beam is further according to the invention switched on when the spot created by it on the sensor is not over a part that is blocked by a mark.

Figure 8:
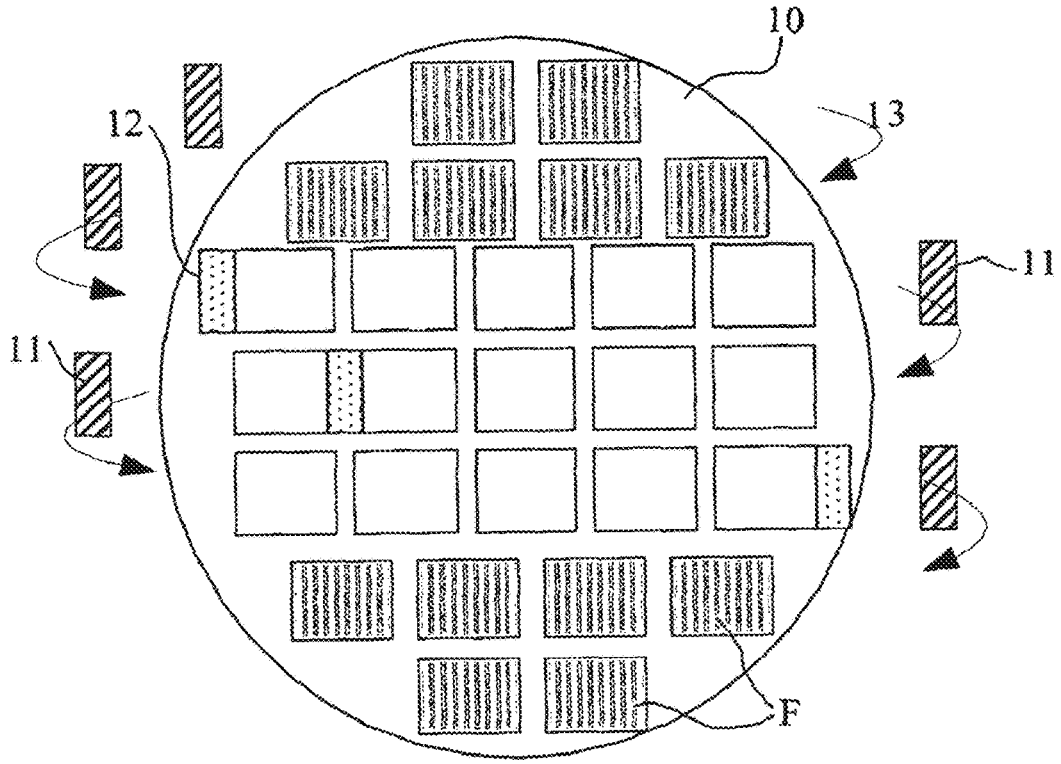
FIG. 8 schematically represents a top view of a wafer and wafer chuck, and part of the fields on said wafer, to be processed by a lithography system, improved by having the present sensor located at a plurality of strategically selected locations outside the wafer.

FIG. 8 schematically provides a top view of a wafer as included in a litho system according to the invention. In this view various fields F have been omitted from the drawing for sake of simplicity of drawing. The drawing illustrates the possibility, due to the strongly reduced costs of a sensor according to the invention, to include a plurality of sensors 11 in close vicinity of a wafer position 10 within a litho system according to the invention. E.g. one sensor may be located at a starting position, e.g. at the left and top side of the wafer position 10 as drawn in the example of FIG. 12. Subsequent sensors are, in terms of number of fields F, distributed at regular distances over a track 13 of a particle beam projector 12 over a wafer position 10. The track 13 is indicated only partly by a number of arrows. The sensors are included in the litho system close vicinity of a wafer 10, so as to minimise travel of the beam tool. In this schematic example, sensors 11 are included after every 5 or 6 fields F of a wafer. After the last group of fields F is treated by the beam tool, a shift is made to the initial position, here at the left top side of the drawing, while the wafer is being unloaded from the system.

As to the different types of measuring enabled by the sensor and performed in a method according to the invention, it is remarked that for current measurement of a writing beam, the beams will be positioned above a YAG area of the detector and with a continuous beam-on measurement the current are measured. A plurality of measurements, in the order of 10-20 is performed and of these the average current is determined. With the sensor according to the invention this can be done in less than 1 second for all 13000 beams. The current variation from beam to beam is determined from the data thus generated. The required time for such current measurement, with 1 nA, typically is 160 μs. However typically within 15 μs a CCD well will be filled. Thus, a number of measurements is performed, typically within a range around 10-15 will be performed, and of these the average current will be determined. This can be done in less than 1 second for all beams. The current variation from beam to beam is also determined from the data. Based on the current measurement the beam tool system determines if the average current of the valid beams is within specification. If not, either the settings of the source are changed until a valid measurement has been reached, or when that is not possible, the system determines if the current is expected to stay constant during the forthcoming exposure or if a source replacement is required. Pulse duration variation is measured by performing a timed switching current measurement with pre-determined on/off ratios of a projected beam.

As already indicated in the above, with respect to beam position, DC (direct current) phase noise and point spread function of the generally Gaussian distributed spot intensity, including rise and fall time, two alternative measurements have been developed, which will in the following be discussed somewhat further in detail: one with the beam continuously on, and one with the beam on only on timed intervals. With the beam continuously on, the beans position and the point spread function (PSF) of the Gaussian distribution in one direction can be determined. With the timed scan, the scanned PSF, including rise or fall time and the shift in scanned e-beam position is measured, including DC phase noise.

For the continuous measurement a stepped deflection is performed with the beam on. The position of the knife-edge with respect to the deflector voltage, a measure for the beam position change with respect to its nominal position, is determined. If the exact position of the edge is now known with respect to the wafer stage position, the exact beam position can be determined. One measurement trace represents the integrated beam spot. Departing from a Gaussian beam profile, the trace thus represents the integral of the Gauss function. This is used to fit the measurement result with a cumulative Gaussian. From the fitted Gauss a PSF is determined. In case it is determined that the spot is not shaped as a Gauss, a more accurate one-time determination of the spot shape is performed. The measurement results are then amongst others fitted with the previously measured spot shape.

Figure 9:
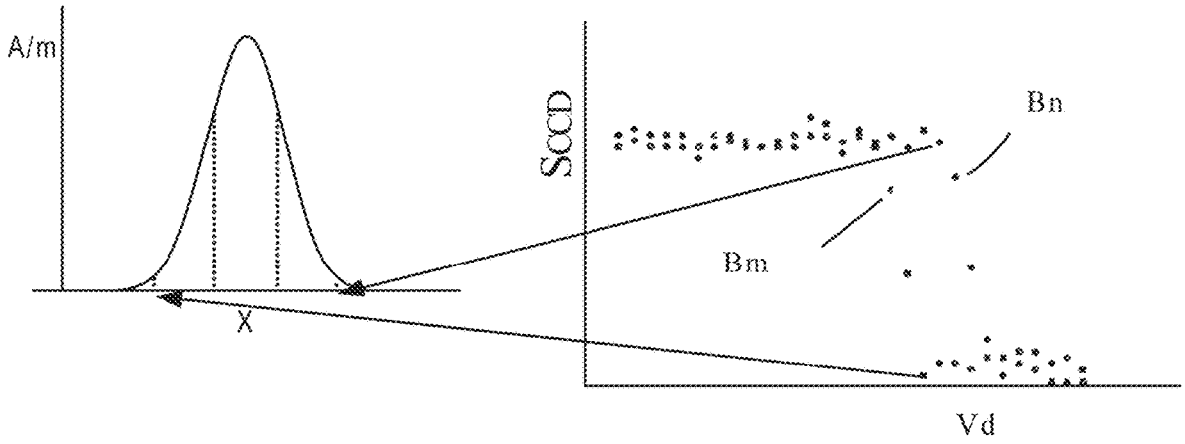
FIG. 9 represents a graphical relation between measurement signal according to the invention and a typical Gaussian distribution of Amperes per meter (A/m) versus size X of said spot.

FIG. 9, i.e. the left hand side graph therein, provides an illustration of the here above discussed continuous measurement and Gaussian distribution of intensity A/m of a spot, alternatively denoted spot shape, as created by a beam 4 on a sensor S according to the invention, or on another target such as a wafer. The right hand side graph provides CCD signal read outs Sccd against deflection of a beam, measured in applied deflection voltages Vd in the writing beam tool for two writing beams Bm and Bn. Each measurement as reflected on the right side corresponds to an area under the Gauss, integrated from infinity to a certain point on the spot, which represents the position of the knife edge. It can be thus be seen that the trace in the right side figure, which is derived from the measurement data therein, represents an integrated Gauss. In the present example with 13000 writing beams in the beam tool, the deflection range for determining the position of a beam is set at 300 nm, while the knife edge is placed at a nominal origin position. In this manner it is ensured that a beam, with a displacement of maximum around 100 nm, crosses the relevant knife-edge. For setting the step size of a measurement it is departed from a minimum number of points required for fitting a Gauss curve. The amount of time needed for measurement of each point is determined by the frame read out speed, which sets the time for each single scan.

Figure 10:
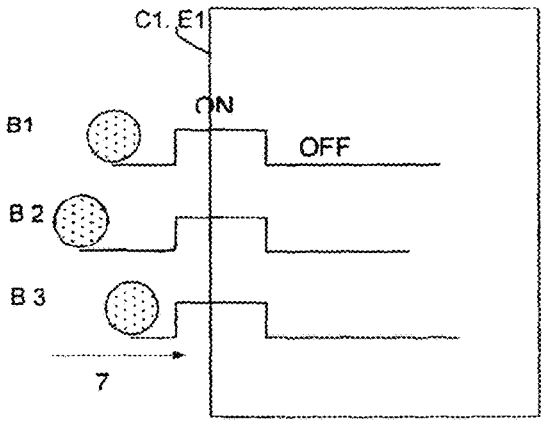
FIGS. 10 and 11 schematically illustrate a so-called timed measurement according to the invention, showing desired positions of beam "on" and "off" relative to a knife edge in FIG. 10, and the subsequent timings thereof for one beam as well as a time delay used thereby in FIG. 11.
Figure 11:
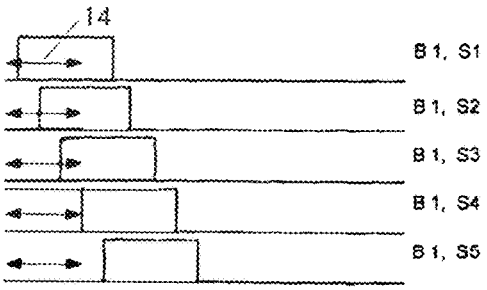

Along FIGS. 10 and 11, as an alternative to the preceding, and as a preferred method of measuring, a timed measurement is illustrated. With a timed measurement method the number of points per single scan is reduced significantly. FIG. 10 in this respect illustrates this so-called timed knife edge principle with figurative representation of a knife edge and the required "on" position of a couple of respective writing beams B1 to B3. A "positioning" of a writing beam "ON" is achieved by using a time delay per channel, which is available from the previous exposure and which is provided within the system, preferably by the beam tool, in particular from the control unit thereof. This time delay is in FIG. 11 represented by the double-sided arrows 14, while the blocks show the period of time where a beam is set to "on" mode. The latter is performed by the blanking system of the beam tool, and implies the presence of a beam spot on the sensor. For a writing beam measurement it may be assumed that the beam is not shifted drastically (less than 10 nm with respect to previous measurement), so a time delay per channel for the previous exposure can be used. The measurement result thus is the position shift B1, S1-B1, S5 of the scanning writing beam B1 with respect to the previous measurement, due to DC phase beam position change. Also the PSF measured with this method includes the rise or fall time. To perform this measurement and obtain at least five data points around the knife-edge, different scans are performed. The width of the beam-on sequence is such that it only covers a single knife-edge. The displacement of the beam-on position is obtained either in the data system or by adjusting the mean deflection voltage.

Apart from the preceding the same invention is in an alternative description defined along the following lines. In this respect it can be stated that the invention relates to a sensor for calibrating the positions and validity of a plurality of charged particle beams with respect to each other. Said apparatus or beam tool comprises a set of charged particle detectors having a known relative position with regard to each other. Said charged particle detector is provided with a detection area comprising a limited number of grid cells. Said limited number of grid cells equals at least four. The charged particle detectors are rigidly attached to each other. The validity of a writing beam is determined by the control unit of the system according to the invention by determining whether, with respect to a pre-determined set of properties to be measured by a writing beam sensor, all of the determined values of the set, i.e. each value of each respective property, fall within a predetermined range defined for each respective property.

The apparatus furthermore comprising a calculation unit: to determine the difference between the design positions of said plurality of charged particle beams and positions of said plurality of charged particle beams detected by said set of charged particle detectors using said known relative position between said set of charged particle detectors, and to calculate correction values to correct for said determined difference. The apparatus is also adapted for adaptation of an individual image pattern of a single beam, based on calculations of said calculation unit. All the same the apparatus is adapted to adapt CD (critical distance) control in the same manner. All type of the indicated adaptations may be implemented in the same apparatus if desired.

Said position correction means of the apparatus, also may comprise a plurality of electrostatic deflectors. Said charged particle detector may comprise: converting means to convert a detected charged particle in at least one photon; photon-receptive means located behind said converting means along the optical pathway to detect said at least one photon created by said converting means.

Said converting means may comprise a plate provided with a fluorescent layer to perform said conversion and said fluorescent plate may comprise a YAG crystal. The photon-receptive means may comprise a limited number of grid cells. An optical system may be positioned between said converting means and said photon-receptive means. Such optical system is arranged to direct the photons created at a certain location by said converting means towards a corresponding location in said photon-receptive means. The optical system is in an embodiment a magnifying optical system. The said mark is attached to said converting means. The said charged particles beam tool is in particular embodied as en electron beam tool. The electron beam tool is more in particular a lithography system.

Apart from the concepts and all pertaining details as described in the preceding the invention also relates to all features as defined in the following set of claims as well as to all details as may be directly and unambiguously be derived by one skilled in the art from the above mentioned figures, related to the invention. In the following set of claims, rather than fixating the meaning of a preceding term, any reference numbers corresponding to structures in the figures are for reason of support at reading the claim, included solely as an exemplary meaning of said preceding term.

The invention claimed is:

[1. A method of measuring properties of a massive amount of charged particle beams of a charged particle beam system in which the charged particle beams are simultaneously converted into light beams by using a converter element, using an array of light sensitive detectors such as diodes, CCD or CMOS devices, located in line with said converter element, for detecting said light beams, electronically reading out resulting signals for each beam individually from said detectors after exposure thereof by said light beams, utilizing said individual signals for determining values for one or more beam properties, thereby using an automated electronic calculator, and electronically adapting the charged particle system so as to correct for out of specification range values for all or a number of said charged particle beams individually, for one or more properties, based on said calculated property values, wherein determination of beam position and/or beam spot size is performed on the basis of signals resulting from a converted charged particle beam (4), thereby using a blocking element, configured to selectively partially and entirely block a beam, included at a known position relative to the converter while shilling the blocking element and the charged particle beam relative to each another by one or more known shifts, wherein the charged particle blocking element (6) is applied integrated with said converter element, located on top thereof, and wherein said detector element is applied integrated with said converter element, located on bottom thereof.]

[2. Method according to claim 1, wherein adaptation of the system is performed by at least one of electronically modifying electronic data for a pattern to be imaged by said charged particle beam system, modifying line width, and electronically influencing a position modifying means of said beam system, for modifying the position of one or more charged particle beams.]

[3. Method according to claim 2, in which the system is adapted solely by modifying said electronic data.]

[4. Method according to claim 1, in which the spot size of said charged particle beams is smaller than the resolution of the converter element.]

[5. Method according to claim 4, in which the intensity of a light beam is utilised for determining a beam property value.]

[6. Method according to claim 5, in which a knife-edge is used in combination with said light intensity for deriving a value for a spot size in one direction.]

[7. Method according to claim 6, in which values for spot size in at least two directions is used for deriving a spot shape.]

[8. Method according to claim 1, wherein determination of beam properties is performed on the basis of a plurality of signals resulting from a stepping proceed of a charged particle beam being scanned in one direction at a time over said blocking element.]

[9. Method according to the claim 1, in which a beam is switched off and on during such scan.]

[10. Method according to claim 1, wherein a switching "off" and "on" is incrementally delayed during multiple scans in one direction, relative to the starting point of the scan.]

[11. Method according to claim 1, wherein pulse duration variation is determined using a measurement with predetermined beans on/off timing.]

[12. Method according to claim 1, wherein the light beans resulting from impingement of a charged particle beam on said converter is optically modified for receipt by said light sensitive detector, in particular by means of a lens system, more in particular such that said resulting light beams are kept apart from one another, i.e. are modified such that no overlap between said resulting beams occurs.]

[13. Method according to claim 1, wherein a number of beam properties is derived using a beam detector comprising a beam blocking element, a converter element an electronically readable photon receptor element, an actuator for realising a relative movement of an electron beam and a beam blocker, and an electronic calculating unit (Cu), said properties at least including one or more of beam position, tinting delay of a possible blanker device acting upon said particle beam, beam spot size, beam current and blanking element functioning.]

[14. The method according to claim 1, wherein the charged particle beans system, at least the beam generating part thereof is provided with an optical sensor, and wherein the detector for detecting beam properties is utilised for optically detecting the position of said system relative to art independently moveable stage for holding a target surface and comprising said detector.]

[15. The method according to claim 1 for measuring properties of a massive amount of charged particle beams of a direct write lithography system.]

[16. A sensor embodied for performing the measuring method in accordance wills claim 1.]

[17. A sensor for simultaneously measuring one or more of a beam position and a beam spot size Or one or more individual particle beams in a lithography system characterized in that the sensor comprises a converter for converting a particle beam into a light beam, as well as a photon receptor arranged for receiving a light beam emitted by said converter upon incidence of a particle beam, and transforming light from said received light beam into an electronic signal, enabling read out of said signal from the sensor by an electronic control system, its which a beam blocking element, configured to selectively partially and entirely block a beam is provided to the surface of said converter, and in which the blocking element is integrated with said converter and located on top thereof and wherein said detector element is applied integrated with said converter element, located on bottom thereof.]

[18. The sensor according to claim 17, characterised in that for each beamlet a separate blocking element is provided.]

[19. The sensor according to claim 17, in which the blocking element is provided with a sharp edge as taken perpendicularly to the surface of the converter means.]

[20. The sensor according to claim 17, wherein the blocking element is provided with a number of sharp edges.]

[21. The sensor according claim 17, in which the blocking element is composed of a heavy material, of a thickness within a range from 50 to 500 nm.]

[22. The sensor according to claim 17, wherein the sensor includes a thin layer of light metal, between said blocking element and said converter of a thickness within the range from 30 to 80 nm.]

[23. The sensor according to claim 17, wherein the sensor includes at least one blocking element having three sharp edges mutually included in a hexagon shape.]

[24. The sensor according to claim 17, in which an optical system is included between the converter element and the light sensitive detector.]

[25. The sensor according to claim 17 for measuring properties of a massive amount of charged particle beams of a direct write lithography system.]

[26. A lithography system for transferring a pattern onto the surface of a target, using a charged particle beam tool, said tool being capable of generating a plurality of charged particle beams for writing said pattern on said surface, in Which either one of the measuring method according to claim 1 and the sensor in accordance with claim 17 is applied.]

[27. A lithography system for transferring a pattern onto the surface of a target, using a charged particle beam tool, said tool being capable of generating a plurality of charged particle beams for writing said pattern on said surface, thereby turning off and on each beam separately at writing said pattern onto the surface by means of a blanker part of said system, and of at least in advance of a writing action, sensing characteristics of a writing beam using a sensor included in a position apart from said target surface, characterised in that the sensor is arranged in the system for determination of beam position and/or beam spot size, and for directly detecting, all of said writing beams simultaneously, the sensor thereto comprising a converter converting each of said particle beans into a light beam, the sensor further comprising an array of light sensitive elements such as photodiode elements, for detecting such light beams, and for generating an electron charge upon exposure to light, which array is read out at least virtually simultaneously by a calculating unit providing correcting value signals upon such read out to a controller of the particle beam tool, and/or to a controller for said pattern, for modifying electronic data representing said pattern, in which both physical displacement of a beam spot and time delay of a blanking part for blanking a beam are measured, in which the sensor further comprises a blocking element, configured to selectively partially and entirely block a beam, included on top of said converter, and wherein said detector element is applied integrated with said converter element, located on bottom thereof.]

[28. The system according to claim 27, wherein adaptation of the system is performed by at least one of electronically modifying electronic data for a pattern to be imaged by said charged particle beam system, modifying line width, and electronically influencing a position modifying means of said beam system, for modifying the position of one or more charged particle beams.]

[29. The System according to claim 27, in which the calculating unit based on information from the sensor, provides corrective values for correcting one or more of the position of a particle beam in two directions of a plane substantially parallel to that of the target area, the intensity or current of the particle beam, the spot position and the spot size, and the sigma, of a Gaussian distribution feature of the particle beam.]

[30. The System according to claim 27, in which a particle beam is scanned over said sensor and switched on at an instance where it is expectedly located at a predetermined position.]

[31. The System according to claim 30, in which the beam is switched on for a pre-determined period of time.]

[32. System according to system claim 27, in which multiple scans are performed over the sensor.]

[33. The System according to claim 27, in which a charged particle beam is scanned over the sensor in three different directions.]

[34. System according to claim 27, in which a charged particle beam is scanned for a multiplicity of steps in a single direction over a sensor at different locations, shifted over at least three times an expected or determined spot diameter of the beam.]

[35. The Lithography system according to claim 27, comprising a stage for an object to be processed by a multi beam charged particle tool, said stage being provided with a multiplicity of sensors according to claim 20, for measuring charged particle beam features, wherein each sensor of said multiplicity is implemented for measuring all charged particle beams of said tool at a time, and wherein sensors of said multiplicity are distributed at various locations near said object to be processed, at mutual distances that are distributed such that calibration of the beam tool is enabled more than once at entirely treating a wafer.]

[36. The Lithography system according to claim 35, wherein said enabling is realised by distributing at least two sensors at even, at least corresponding distances with respect to the track which the beam tool is to follow relative to said object to be processed.]

[37. Lithography system according to claim 35, wherein the method according to claim 1, or the sensor according to claim 20 is applied.]

*38. A multi-beam charged particle system comprising a multi beam charged particle tool configured to generate multiple charged particle beams, the system comprising:*

*a sensor configured to detect the charged particle beams, the sensor comprising:*

*a structure comprising a plurality of patterns that are equally oriented and periodically arranged, wherein one or more patterns of the plurality of patterns are assigned per beam among the multiple charged particle beams,*

*wherein the structure is configured to selectively block the charged particle beams partially or entirely.*

*39. The multi-beam charged particle system of claim 38, wherein the plurality of patterns are defined by at least one knife edge.*

*40. The multi-beam charged particle system of claim 39, further comprising:*

*a deflector for scanning each one of the charged particle beams over the plurality of patterns in a scanning direction relative to a first knife edge of the at least one knife edge.*

*41. The multi-beam charged particle system of claim 40, wherein the scanning direction has a sharp angle with respect to a second knife edge of the at least one knife edge.*

*42. The multi-beam charged particle system of claim 39, wherein the plurality of patterns have three sharp edges oriented at a different angle with each other.*

*43. The multi-beam charged particle system of claim 42, wherein the plurality of patterns have a hexagon shape.*

*44. The multi-beam charged particle system of claim 42, wherein the charged particle beams are scanned in at least three directions perpendicular to the three sharp edges.*

*45. The multi-beam charged particle system of claim 42, wherein adjacent sharp edges among the three sharp edges have an internal angle greater than 90 degrees and less than or equal to 120 degrees.*

*46. The multi-beam charged particle system of claim 38, wherein the sensor is configured to simultaneously measure one or more of a beam position and a beam spot size of one or more of the multiple charged particle beams.*

*47. The multi-beam charged particle system of claim 38, wherein the sensor is configured to simultaneously measure beam positions of the multiple charged particle beams.*

*48. The multi-beam charged particle system of claim 38, wherein the sensor further comprises a detector configured to detect the charged particle beams incident on the detector and the detector is positioned downstream of the beams from the plurality of patterns.*

*49. The multi-beam charged particle system of claim 38, wherein the sensor comprises a converter element for converting the charged particle beams into light beams and the detector is configured to detect the converted light beams.*

*50. The multi-beam charged particle system of claim 38, further comprising an automated electronic calculator (CU) adapted for calculating one or more charged particle beam property values for each beam of the charged particle beams based on signals electronically read out and resulting from the sensor, wherein the signals provide a set of measurement data for each charged particle beam individually as it is scanned over the plurality of patterns and the electronic calculator is configured to read out the signals substantially simultaneously.*

*51. A sensor for detecting charged particle beams of a multi-beam charged particle tool, the sensor comprising:*

*a structure comprising a plurality of patterns that are equally oriented and periodically arranged, wherein one or more patterns of the plurality of patterns are assigned per beam among the charged particle beams,*

*wherein the structure is configured to selectively block the charged particle beams partially or entirely.*

*52. The sensor of claim 51, wherein the plurality of patterns are defined by at least one knife edge and the plurality of patterns are included at known positions relative to the tool.*

*53. The sensor of claim 52, wherein the plurality of patterns have three sharp edges oriented at a different angle with each other.*

*54. The sensor of claim 53, wherein adjacent sharp edges among the three sharp edges have an internal angle greater than 90 degrees and less than or equal to 120 degree.*

*55. The sensor of claim 51, further comprising a detector configured to detect the charged particle beams incident on the detector and the detector is positioned downstream of the beams from the plurality of patterns.*

*56. The sensor of claim 51, wherein the sensor is configured to simultaneously measure beam positions of the multiple charged particle beams.*

*57. The multi-beam charged particle system of claim 38, wherein the plurality of patterns are defined by at least one knife edge configured to determine at least one position of the charged particle beams.*

* * * * *